March 29, 1960 S. T. MARTIN 2,930,107

SEMICONDUCTOR MOUNT AND METHOD

Filed July 16, 1953

INVENTOR
STUART T. MARTIN
BY Paul S Martin
ATTORNEY

United States Patent Office 2,930,107
Patented Mar. 29, 1960

2,930,107

SEMICONDUCTOR MOUNT AND METHOD

Stuart T. Martin, Winchester, Mass., assignor, by mesne assignments, to Sylvania Electric Products Inc., Wilmington, Del., a corporation of Delaware Application July 16, 1953, Serial No. 368,248

4 Claims. (Cl. 29—25.3)

This invention relates to semiconductor elements and to methods for mounting them. More particularly it relates to methods of manufacturing a semiconductor mount assembly for use in electrical devices in which one of the elements is a semiconductor material such as silicon or germanium and the other element is usually a rectifying contact.

One form of semiconductor devices have been manufactured by cutting a prepared slab or wafer of semiconductor material into a number of very small, thin squares or dice and individually soldering each small square to a metallic supporting pin. The mounted semiconductor material was then further processed in some instances so as to be suitable for final assembling operations. When assembled, a particular form of such semiconductor devices comprises a supporting or mounting pin with the semiconductor material mounted thereon, a sharp fine wire in endwise contact with the semiconductor material, within a protective supporting enclosure as of glass or ceramic material. Conventional electrical leads are connected to both the metal point contact and the supporting pin and extend through the enclosure.

A difficult and time consuming step in the assembly of the device is the mounting of each minute and individual square of semiconductor material upon its supporting pin. Heretofore, due to the very small size of the components it has been a slow and tedious operation to solder properly the supporting pin to a small portion of semiconductor material and at the same time secure proper alignment of the components. This operation was carried out by hand usually in no small measure due to the different surfaces of the dice. One side of each piece is commonly electroplated to facilitate the solder-mounting while the other side is at least partly prepared differently to present the critical surface ultimately required for best performance.

It is accordingly an object of the present invention to provide a method for facilitating the mounting of a crystal on a support.

Another object of the invention is to provide a method for mounting semiconductors which may be accomplished without employing highly skilled and trained assemblers.

A further object of the invention is to provide a method for mounting semiconductors which allows all steps relating to the processing and preparation of semiconductor material to be completed before the material is mounted on its support without substantial hazard to the prepared surface arising in the mounting operation.

A still further object of the invention is to provide a method for mounting semiconductors whereby the semiconductor elements are more quickly and accurately aligned upon their supports.

Yet another object of the invention is to provide a method for mounting semiconductors which will promote speed and economy in the manufacture of large quantities of semiconductor devices.

Still another object is to make a semiconductor device which lends itself to ease in production.

For a better understanding of the invention, together with other and further objects thereof, reference is made to the following detailed description taken in connection with the accompanying drawings in which.

Although the mounting method is described herein as applying to germanium, yet it is understood that the method may be employed to mount a wide variety of semiconductor materials, including silicon for example, and is not limited to germanium. Similarly the invention will be recognized as being adapted equally well to the manufacture of other forms of semiconductor devices such as to multiple rectifying-contact transistors as to point-contact rectifiers.

Figure 1:
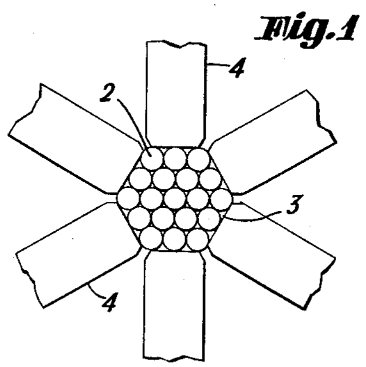
Fig. 1 is a top view of a number of supporting pins held in hexagonal arrangement by a clamp whose jaws only are shown, partly broken away.

In Fig. 1, a number of supporting pins 2 are shown upon which the germanium is to be mounted, clamped in hexagonal arrangement by jaws 4. The pins 2 are of a type conventionally used in a well known form of rectifier, to support small pieces of semiconductor material when used in conjunction with point-contacts or "cat whiskers." In an example, the supporting pins are fabricated of nickel wire and are of the order of .03" in diameter. Although cylindrical pins are preferably utilized as a supporting base for the germanium, yet other bases, such as square or hexagonal metallic pins may be used satisfactorily where the envelope of the finished device is designed for such pins. Discrete portions of germanium are secured to a large number of supporting pins simultaneously, as a notable feature of this invention. A large number of short lengths of wire are first prepared, optionally coating an end of each with a cap of conventional solder. Alternatively the pins may be tin-plated or other suitable tinning methods may be used. As a still further alternative, the semiconductor to be secured may be tinned or solder coated.

A large number of the tinned pins are then arranged in an upright position between the jaws 4 of a six-jaw clamp. The jaws are of sufficient height and are suitably disposed so as to define an enclosure 3 between the faces of the jaws 4. One reason for choosing the hexagonal disposition of the jaws is that with this arrangement the cylindrical pins will fall into a mechanically stable honeycomb pattern, a pattern that may furthermore closely approximate the roughly round shape of the semiconductor wafers sliced from the larger ingot of the material. However, other arrangements of the jaws such as a triangular or square disposition may be used if desired.

The faces of the jaws are of sufficient vertical height to provide a firm support against which the pins may rest and be held securely in an upright position. Several of the jaws should be made movable in order to seize the pins loaded into the enclosure, whereby the pins are forced to arrange themselves snugly in honeycomb fashion. Before the jaws are tightened finally the pins 2 should be adjusted to equal height, as by resting the exposed end surfaces of the pins against a flat plate, or by holding a flat plate against the pin ends and tamping the plate.

A slab of germanium 6 is next prepared for soldering and mounting to the cluster of supporting pins 2. The wafer or slab of germanium approximately .005" thick for example, is cut from a solid ingot of the material, suitably a single-crystal ingot. It is ground flat and polished, advantageously plated with rhodium or copper or the like to facilitate soldering the germanium wafer to the pins and to provide a low resistance non-rectifying or ohmic contact therebetween. The opposite side of the wafer is specially prepared for rectification, as by etching, washing, drying conventionally.

The plated wafer 6 is then placed upon the upper end surfaces of the grouped supporting pins 2 in such a manner that the plated surface is in contact with the tinned end surfaces 8 of the pins. The pins may be flux-coated at their stage to facilitate soldering. The clustered pins are heated gently until the tinned end surfaces are soldered to the plated surface of the wafer, thereby firmly securing the slab of germanium 6 to the bundle of pins 2 upon cooling. The drawing symbolically shows relatively few pins. When it is considered that a wafer may be an inch or more in diameter, and the pins are only 0.03 inch, it will be seen that hundreds of pins may be involved.

Figure 2:
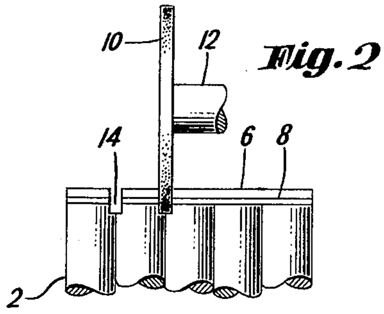
Fig. 2 shows the pins in elevation during a cutting step in the preparation of the semiconductor mount assembly.
Figure 3:
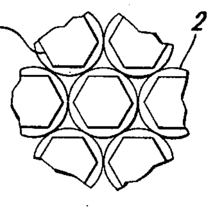
Fig. 3 is a fragmentary top view of a cluster of supporting pins greatly enlarged, with each pin carying its piece of semiconductor material mounted thereon.

The pins are then detached from one another in general by dividing the wafer off into discrete pieces so that each piece is associated with a support pin. The preferred form of dividing may be effected by making a series of successive parallel cuts through the semiconductor sheet 6 by means of a metallic cutting wheel 10 charged with diamond particles and rotated by a suitably driven shaft 12, as shown in Fig. 2. The cutting operation allows each pin to be separated from adjacent pins but provides that a minute, discrete portion of germanium shall be left mounted on the end surface of each pin, as shown in Fig. 3. While only one saw is illustrated, ganged saws may be used as in conventional practice for making numerous parallel properly spaced saw cuts. The saw cuts should be as thin as practicable and should be spaced to divide the pins as illustrated in Fig. 3.

Although it is preferable that the germanium areas be separated with a diamond wheel, yet any other suitable means may be used. For example, the germanium sheet may be divided into small areas by scribing or scoring the sheet into areas of desired configuration by means of a sharp pointed scribing tool. The pins, with a portion of germanium attached, can then be separated by snapping or breaking them away from the remainder of the group. As the break will occur along the score lines, the mounted portion of germanium will have the desired configuration.

It is desirable that the portion of germanium remaining secured to an upright end of a pin should partake of a hexagonal configuration. Such a configuration nearly fills the circular end area of the pins 2, and yet lends itself to ease in cutting with a saw; obviously it is to be preferred to other configurations which cover less area, as a square. Furthermore, overhanging portions of the wafer (extending outside the edges of the end surfaces of the pins) are precluded when the hexagonal arrangement is used, whereas a square array with economically thin cuts would leave projecting corners. This should be avoided where the pin is to slide into a protective envelope along a bore only large enough to receive the pin. A hexagonal arrangement will result if only three series of spaced, parallel saw cuts 14 are made across the entire slab of germanium covering the pins 2, with the cuts of each series displaced 60° from the cuts of a preceding series.

To insure that no portion of a germanium die is left to extend beyond the outer periphery of a pin 2, the saw cut or slot 14 is made sufficiently deep so as to pass through both the semiconductor slab 6, the tinned layer 8, and a short distance into the body of pin 2. When the pins are separated each will have formed therein a neck portion 15 whose length and width will be determined by the thickness of the diamond wheel 10 and the depth of the saw cut 14.

Figure 4:
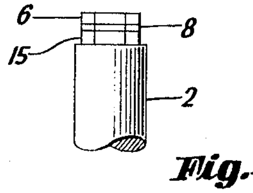
Fig. 4 is a corresponding greatly enlarged side view of an assembled semiconductor mount.

When prepared as described, each completed mount assembly will have the exposed surface of its piece of semiconductor material accurately disposed perpendicular to its supporting pin. When it is realized that a sharp contact that is to engage this surface would "skate" across a slant surface this feature is of importance. A completed semiconductor mount made in accordance with the method just described and ready for assembly with one or more point-contact wires in a suitable envelope or enclosure is shown in Fig. 4.

In some instances difficulty may be encountered in successfully utilizing the mounting method due to fouling of the diamond saw by particles of soft solder from the tinned pin end layer 8. Solder has a tendency to stick to the abrasive surface of the cutting wheel, thus in time impairing the efficiency of the cutting wheel.

Figure 5:
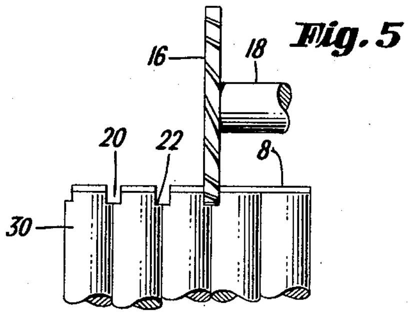
Fig. 5 shows a cluster of pins, in elevation, during a cutting step in a modified method of manufacture of the device and before the semiconductor material is mounted on the supporting pins.

Therefore, to prevent the possibility of this occurrence, the following modified method of manufacture of the mount has been devised. After pins 30 have been tinned and clustered in enclosure 3 but before the germanium slab 6 is soldered to the cluster, a series of parallel cuts is formed as shown in Fig. 5, with each series successively displaced 60° from the preceding series of cuts. These cuts are made across the top surfaces of the pins with a cutter having a blade 16, that is somewhat thicker than the blade 10, and rotated by a shaft 18. The cutter is of such material and the formation and spacing of the teeth are such that its periphery will not be fouled by the soft solder particles. As a result of the milling cutter operation, hexagonal slots or recesses 20 will be formed in the end surfaces of pins 30. This cutting step has the further advantage of preventing the pins from becoming soldered to each other when the solder on the pin ends is heated in later securing the wafer in place.

Figure 6:
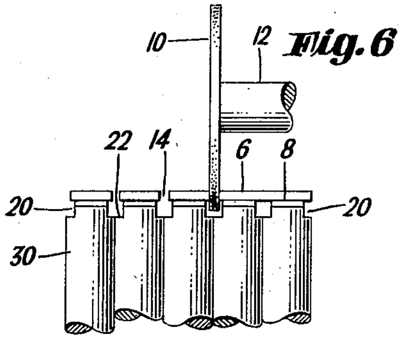
Fig. 6 shows a further step in the modified mounting method.

The plated slab of germanium is then soldered to the pre-slotted pins 30 by heating, as before. The series of three sets of spaced parallel cuts 14, each series being successively spaced 60° from the preceding series of cuts, are again made as before across the entire slab of germanium by means of a diamond charged cutting wheel or other suitable cutting means. However, the diamond cutting wheel will not be clogged during the germanium cutting step by soft solder particles, as not only have all portions of the soldered layer in its path been removed, but the wheel is free to rotate in the pre-cut slot 20, without coming in contact with the sides of the slot or the shoulders 22 of supporting pin 30. The width of slot 20 is determined by the thickness of the cutter 16. As the blade 16 is appreciably wider than the blade of diamond wheel 10, the diamond cutter easily passes through the pre-cut slots 20 (Fig. 6) during the semiconductor dividing step.

Figure 7:
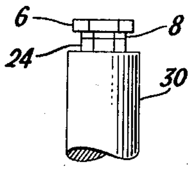
Fig. 7 shows a finished semiconductor mount in elevation, manufactured in accordance with the method of Figs. 5 and 6.

A semiconductor mount assembled in accordance with the steps of the modified mounting method is shown in Fig. 7. The completed mount in the modified embodiment has a small piece or die 6 of germanium of hexagonal configuration soldered to a neck portion 24 of supporting pin 30. The neck portion also has a hexagonal configuration, as a necessary result of the preparatory parallel 60° cuts made in the supporting pins above. Due to the difference in width of the cuts performed during the two cutting steps, the germanium will extend outwardly beyond the neck portion 24 of the supporting pin 30. However, as the diamond cutter has a finite thickness, the germanium hexagon cannot extend beyond the outer periphery of its supporting pin. This is a desirable feature, as some applications of the device may require that the whole assembly be able to pass through passages in a suitable holder whose diameters are only slightly larger than that of a supporting pin. Obviously, if germanium does not extend beyond the outer periphery of its supporting pin, the mount can enter a bore only large enough to receive the pin freely and without danger of dislodging the soldered germanium from its supporting pin.

Figure 8:
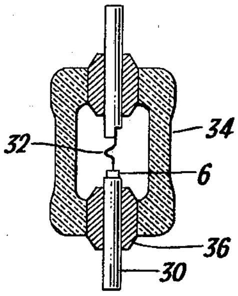
Fig. 8 is an enlarged longitudinal cross-section of a form of semiconductor device to which the invention applies.

In Fig. 8 a completed diode rectifier unit is shown in which a sharp contact 32 within envelope or enclosure 34 of glass with metal tubes 36 sealed to its ends engages the flat surface of the germanium 6 with axial thrust. That the germanium surface is reliably fixed perpendicular to the axis of its supporting pin 2 or 30 (Fig. 4 or 7), the uniformity of the whole quantity of units is vastly improved over the practice of soldering the dice to the pins individually. Moreover, the soldering flux that may be used underneath the germanium wafer before the dividing operation does not spatter onto the delicate top surface as it tends to do in the individual soldering practice. Because of this, cleaning and etching operations after mounting the germanium may be avoided after the dividing of the wafer into dice in the novel method, whereas previously it was desirable but difficult to etch and clean the surfaces of large numbers of mounted dice.

While the present invention has been disclosed by means of specific illustrative embodiments thereof, it will be obvious to those skilled in the art that various changes and modifications in the methods described or in the resulting product may be made without departing from the spirit of the invention as defined in the appended claims. Consequently those claims should be accorded due latitude of interpretation.

What is claimed is:

1. A method for mounting semiconductors on bases which comprises arranging a plurality of supporting pins in a clustered association with longitudinal axes parallel and with ends disposed in a common plane forming separating slots and thereby spacing the ends of the clustered pins from each other, fastening a wafer of semiconductor material to the spaced end surfaces of the pins, and dividing the wafer along said separating slots into plural pieces, each piece lying above a respective pin.

2. A method for mounting semiconductors on bases which comprises, coating a plurality of supporting pins with a layer of solder, arranging the pins in a clustered association with longitudinal axes parallel, cutting slots in the end surface formed by the clustered pins so as to define neck portions on each pin with the side walls of each neck portion free of solder, assembling a wafer of semiconductor material to the solder covered end surfaces of the clustered pins, and cutting slots narrower than the first mentioned slots in said wafer by means of a cutting tool extending into the first mentioned slots but out of contact with said pins.

3. A method for mounting semiconductors on bases which comprises coating one surface of a flat wafer of semiconductor material with a metallic layer, tinning a plurality of cylindrical supporting pins, gripping a cluster of pins with the outer pins confined within hexagonal walls, with the longitudinal axes of the pins in parallel relation and with coplanar tinned ends, cutting three sets of parallel slots in the end surface of the cluster of supporting pins so as to define neck portions of hexagonal configuration, placing the wafer of semiconductor material in electrical contact with the upright ends of said supporting pins, applying heat to the pins so that the tinned coating on said pins forms a soldered junction between the wafer and the ends of the pins, and dividing the wafer into areas of hexagonal configuration larger than the hexagonal end surfaces of said supporting pins such that each area lies above a pin.

4. A method for mounting semiconductors on bases which comprises, coating a plurality of supporting pins with a layer of solder, arranging the pins in a clustered association with longitudinal axes parallel, cutting slots in the end surface formed by the clustered pins so as to define neck portions on each pin with the side walls of each neck portion free of solder, assembling a wafer of semiconductor material to the solder covered end surfaces of the clustered pins, and dividing the wafer along said slots to form a plurality of pieces, each piece lying above the neck portion of a respective pin.

References Cited in the file of this patent

UNITED STATES PATENTS

| | | |
|---|---|---|
| 2,359,377 | Miller et al. | Oct. 3, 1944 |
| 2,723,444 | Harvey | Nov. 15, 1955 |